(12) United States Patent
Cheng et al.

(10) Patent No.: US 9,634,289 B2
(45) Date of Patent: Apr. 25, 2017

(54) TRANSPARENT DISPLAY PANEL AND MANUFACTURING METHOD THEREOF, AND TRANSPARENT DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN); Yanli Wang, Beijing (CN); Deming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/769,095

(22) PCT Filed: Oct. 17, 2014

(86) PCT No.: PCT/CN2014/088821
§ 371 (c)(1),
(2) Date: Aug. 19, 2015

(87) PCT Pub. No.: WO2016/015385
PCT Pub. Date: Feb. 4, 2016

(65) Prior Publication Data
US 2016/0293894 A1    Oct. 6, 2016

(30) Foreign Application Priority Data

Jul. 31, 2014   (CN) .......................... 2014 1 0372889

(51) Int. Cl.
*H01L 29/205*   (2006.01)
*H01L 51/52*    (2006.01)
(Continued)

(52) U.S. Cl.
CPC .......... *H01L 51/5275* (2013.01); *H01L 27/32* (2013.01); *H01L 27/322* (2013.01);
(Continued)

(58) Field of Classification Search
CPC ........................ H01L 51/5275; H01L 51/5237
(Continued)

(56) References Cited

U.S. PATENT DOCUMENTS

| 2010/0052519 A1 | 3/2010 | Jeon et al. |
| 2013/0182418 A1* | 7/2013 | Sawabe ..................... F21L 4/00 362/157 |

FOREIGN PATENT DOCUMENTS

| CN | 101777573 A | 7/2010 |
| CN | 102208432 A | 10/2011 |

(Continued)

OTHER PUBLICATIONS

International Search Report and Written Opinion from PCT Application Serial No. PCT/CN2014/088821, dated Apr. 28, 2015, 12 pages.

(Continued)

*Primary Examiner* — Anthony Ho
(74) *Attorney, Agent, or Firm* — Kinney & Lange, P.A.

(57) ABSTRACT

Embodiments of this disclosure provide a transparent display panel and a manufacturing method thereof, and a display device. The transparent display panel comprises a plurality of light-emitting regions and a plurality of transparent regions. The transparent display panel further comprises at least one light-guiding component disposed on a light-emitting side of the transparent display panel, wherein the at least one light-guiding component is configured to transmit a part of light emitted from the light-emitting regions to the transparent regions. In the transparent display panel, a light-guiding component is used to transmit the light emitted by the light-emitting subpixels in the light-emitting regions to the transparent regions, and a plurality of light-redirecting members formed on a surface of the light-guiding component are used to change the direction of light transmitted to the transparent regions and to emit the light (Continued)

from the light-emitting side of the transparent regions. As a result, display uniformity of the whole transparent display panel is improved, and a better display performance can be achieved.

23 Claims, 5 Drawing Sheets

(51) Int. Cl.
*H01L 51/56* (2006.01)
*H01L 27/32* (2006.01)
(52) U.S. Cl.
CPC ...... *H01L 27/3211* (2013.01); *H01L 27/3262* (2013.01); *H01L 27/3276* (2013.01); *H01L 51/52* (2013.01); *H01L 51/5218* (2013.01); *H01L 51/5234* (2013.01); *H01L 51/5237* (2013.01); *H01L 51/5271* (2013.01); *H01L 51/56* (2013.01); *H01L 2227/323* (2013.01); *H01L 2251/5307* (2013.01)

(58) Field of Classification Search
USPC .......................................................... 257/91
See application file for complete search history.

(56) References Cited

FOREIGN PATENT DOCUMENTS

| CN | 103168373 A | 6/2013 |
| CN | 103208590 A | 7/2013 |

OTHER PUBLICATIONS

First Chinese Office Action dated Jul. 6, 2016, for corresponding Chinese Application No. 201410372889.6.

* cited by examiner

TRANSPARENT DISPLAY PANEL AND MANUFACTURING METHOD THEREOF, AND TRANSPARENT DISPLAY DEVICE

BACKGROUND OF THE INVENTION

Field of the Invention

This disclosure relates to display technologies, and specifically to a transparent display panel and manufacturing method thereof, and a transparent display device.

Description of the Related Art

In recent years, more and more manufactures have been devoting on researches of transparent display products. Transparent display screens are widely used in show windows of marketing places due to its transparency, so that when we watch the information displayed by a display screen, we can also look through the screen and see the product exhibited behind the screen. When the actual product and its information are combined such that the customers may have an overall understanding of the product, the customers may have a better experience with the exhibition.

In order to make an OLED display device looks as if it is transparent, currently, a part of a subpixel is configured to form a light-emitting region and other part thereof is configured to form a transparent region; or, some of subpixels are configured to form a light-emitting region while others are configured to form a transparent region, so that a transparent display can be achieved.

However, making a part of a subpixel or some subpixels transparent such that natural light can penetrate a transparent display through a transparent region may decrease an overall brightness of a display device and causes a non-uniform display brightness and in turn a bad display performance.

SUMMARY OF THE INVENTION

The present invention has been made to provide a transparent display panel and a manufacturing method thereof, and a transparent display device to solve the defect of non-uniform display brightness in existing transparent display device.

According to a first aspect of the present disclosure, there is provided a transparent display panel comprising a plurality of light-emitting regions and a plurality of transparent regions. The transparent display device further comprise at least one light-guiding component disposed on a light-emitting side of the transparent display panel, wherein the at least one light-guiding component is configured to transmit a part of light emitted from the light-emitting regions to the transparent regions.

In one embodiment, the light-guiding component comprises a first portion disposed in a corresponding light-emitting region and a second portion disposed in a corresponding transparent region, and a non-light-emitting surface of the second part of the light-guiding component is provided with a plurality of light-redirecting elements.

In another embodiment, the plurality of light-redirecting elements are a plurality of protuberances or concaves facing subpixels.

In a further embodiment, a first resin layer is disposed on a non-light-emitting side of the second part of the light-guiding component and in contact with the non-light-emitting surface of the second part of the light-guiding component, the first resin layer has, on a surface thereof contacting the second part of the light-guiding component, a plurality of concaves or protuberances matching with the plurality of protuberances or concaves of the light-guiding component.

The transparent display panel may comprise a plurality of subpixels, each subpixel comprises a light-emitting portion and a lightless portion, the light-emitting portions of the subpixels are disposed in the light-emitting regions and the lightless portions of the subpixels are disposed in the transparent regions.

In an embodiment, the light-emitting portion of each subpixel comprises a first electrode layer, a light-emitting layer, and a second electrode layer, and the lightless portion of each subpixel does not comprise the first electrode layer and/or the light-emitting layer.

In another embodiment, the transparent display panel comprises a plurality of light-guiding components, the first portion of each light-guiding component is disposed on a light-emitting side of the light-emitting portion of a corresponding subpixel, and the second portion of each light-guiding component is disposed on a light-emitting side of the lightless portion of the corresponding subpixel.

In a further embodiment, the transparent display panel comprises one light-guiding component, and the light-guiding component comprises a plurality of first portions and a plurality of second portions, each first portion is disposed on a light-emitting side of the light-emitting portion of a corresponding subpixel, and each second portion is disposed on a light-emitting side of the lightless portion of the corresponding subpixel.

The transparent display panel may comprise a plurality of subpixels, wherein the plurality of subpixels comprise a plurality of light-emitting subpixels and a plurality of lightless subpixels, the light-emitting subpixels are disposed in the light-emitting regions, and the lightless subpixels are disposed in the transparent regions.

In an embodiment, each light-emitting subpixel comprises a first electrode layer, a light-emitting layer, and a second electrode layer, and each lightless subpixel does not comprise a first electrode layer and/or a light-emitting layer.

In another embodiment, the transparent display panel comprises a plurality of light-guiding components, the first portion of each light-guiding component is disposed on a light-emitting side of at least one corresponding light-emitting subpixel, and the second portion of each light-guiding component is disposed on a light-emitting side of at least one corresponding lightless subpixel.

In a further embodiment, the transparent display panel comprises one light-guiding component, and the light-guiding component comprises a plurality of first portions and a plurality of second portions, each first portion is disposed on a light-emitting side of at least one corresponding light-emitting subpixel, and each second portion is disposed on a light-emitting side of at least one corresponding lightless subpixel.

Transparent display panel may comprise a plurality of subpixels, the plurality of subpixels comprise at least one first subpixel, at least one second subpixel, and/or at least one third subpixel; wherein the at least one first subpixel comprises a light-emitting portion and a lightless portion, the light-emitting portion of the first subpixel is disposed in the light-emitting region and the lightless portion of the first subpixel is disposed in the transparent region; and wherein the at least one second subpixel is light-emitting subpixel located in the light-emitting region and the at least one third subpixel is lightless subpixel located in the transparent region.

In an embodiment, the light-emitting layer emits white light and the transparent display panel further comprises a filter layer disposed on a light-emitting side of the first part of the light-guiding component.

In another embodiment, isolating layers are disposed between adjacent light-guiding components of the plurality of light-guiding components.

In a further embodiment, a material of the light-guiding component has a refractive index higher than that of a material of the first resin layer.

In a still further embodiment, a subpixel located in the transparent regions is not provided with a thin film transistor and a metal wire.

Wherein, a material of the light-guiding component has a refractive index higher than that of a material of the first resin layer.

According to a second aspect of the present disclosure, there is provided a transparent display device, which comprises a transparent display panel as described above.

According to a third aspect of the present disclosure, there is provided a method for manufacturing a transparent display panel, comprising a step of: manufacturing a transparent display panel comprising a plurality of light-emitting regions and a plurality of transparent regions; and manufacturing at least one light-guiding component on a light-emitting side of the transparent display panel for transmitting a part of light emitted from a light-emitting region to a transparent region.

In an embodiment, the step of manufacturing the transparent display panel comprises forming a pixel defining layer and patterning the pixel defining layer to form portions corresponding to the light-emitting regions and portions corresponding to the transparent regions.

In another embodiment, the step of manufacturing the transparent display panel may further comprises forming a plurality of subpixels, each of which comprises a light-emitting portion formed in a light-emitting region and a lightless portion formed in a transparent region.

In a further embodiment, the step of manufacturing the transparent display panel may further comprises forming a plurality of subpixels comprising a plurality of light-emitting subpixels formed in the light-emitting regions and a plurality of lightless subpixels formed in the transparent regions.

In a still further embodiment, the step of manufacturing the transparent display panel may further comprises forming a plurality of subpixels comprising at least one first subpixel, at least one second subpixel, and at least one third subpixel; wherein each of the at least one first subpixel comprises a light-emitting portion formed in a light-emitting region and a lightless portion formed in a transparent region; and wherein each of the at least one second subpixel is a light-emitting subpixel formed in a light-emitting region, and each of the at least one third subpixel is a lightless subpixel formed in a transparent region.

In a still further embodiment, the step of manufacturing at least one light-guiding component comprises steps of: forming a first resin layer on a subpixel; patterning the first resin layer to remove a portion of the first resin layer located in the light-emitting regions so as to expose the subpixel, and to form a plurality of concaves or protuberances on a surface of the first resin layer located in the transparent regions; and forming, on the exposed subpixel and on the first resin layer, a material layer for light-guiding component.

In a still further embodiment, the step of manufacturing at least one light-guiding component further comprises steps of: forming, in the material layer for light-guiding component, an isolating layer at a boundary of a region including at least one light-emitting region and at least one transparent region.

In a still further embodiment, the step of forming the isolating layer comprises: forming, in the material layer for light-guiding component, an isolating region at the boundary of the region including at least one light-emitting region and at least one transparent region; and filling an isolating material into the isolating region or coating an isolating material in the isolating region.

In a still further embodiment, the step of forming a plurality of subpixels comprises steps of: forming a first electrode layer in the plurality of light-emitting regions; forming a light-emitting layer on the first electrode layer; and forming a second electrode layer on the light-emitting layer and on the pixel defining layer.

In a still further embodiment, the first electrode layer is formed such that an edge thereof extends upward along the pixel defining layer so as to laterally enclose the light-emitting layer formed on the first electrode layer.

In a still further embodiment, the manufacturing method further comprises a step of: forming, outside the transparent display panel and the at least one light-guiding component, an encapsulating layer.

In the technical solutions disclosed herein, a light-guiding component is provided at a light-emitting side of the transparent display panel for transmitting light emitted by subpixels within the light-emitting regions to the transparent regions, then a plurality of light-redirecting elements are provided on a surface of the light-guiding component, so that display uniformity of the whole transparent display panel can be improved and a better display performance is achieved through changing direction of light transmitted into the transparent regions and emitting the light out of the transparent regions from a light-emitting side.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
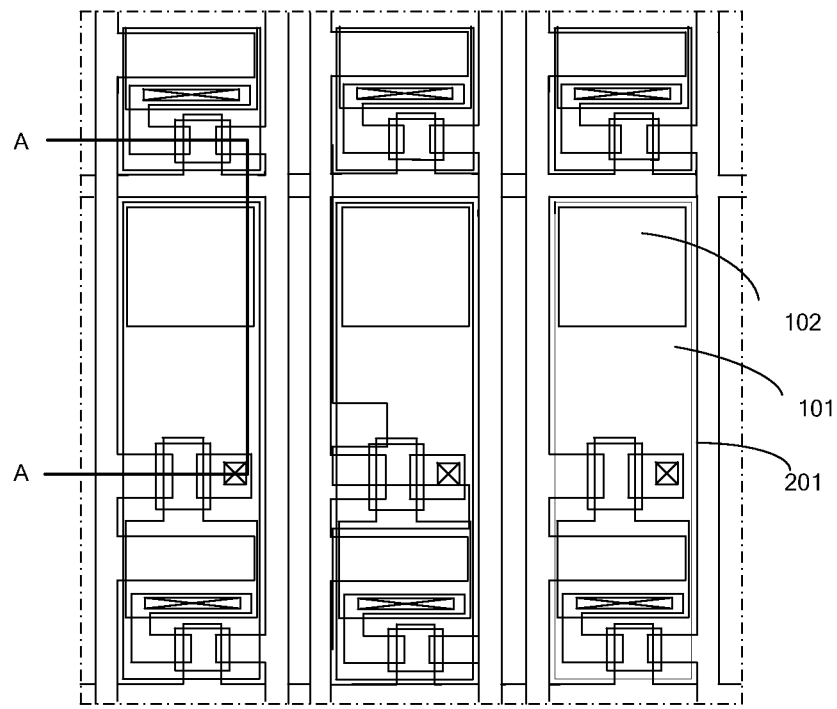
FIG. 1 shows an illustrative top view of a transparent display panel according to a first embodiment of the invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

The present disclosure provides a transparent display panel, which comprises: a plurality of light-emitting regions; a plurality of transparent regions; and at least one light-guiding component disposed on a light-emitting side of the transparent display panel, wherein the at least one light-guiding component is configured to transmit a part of light emitted from the light-emitting regions to the transparent regions.

Optionally, the light-guiding component is made of a material having a relative high refractive index, for example, a material or a combination selected from: allyl ditheylene glycol carbonate, polymethyl methacrylate (PMMA), polycarbonate, and polystyrene.

When light from the light-emitting regions is transmitted into the light-guiding component at an angle, since the light guiding component has a relative high refractive index, the light is restrained to transmit within the light-guiding component, and thereby light introduced into the light-guiding component from a portion of the light-guiding component located in the light-emitting regions is refracted and directed to a portion of the light-guiding component located in the transparent regions and exits from the transparent regions.

Optionally, light from the light-emitting regions is the light emitted by subpixels in the transparent display panel.

Technical solution of this disclosure will be described in conjunction with specific embodiments.

Figure 2:
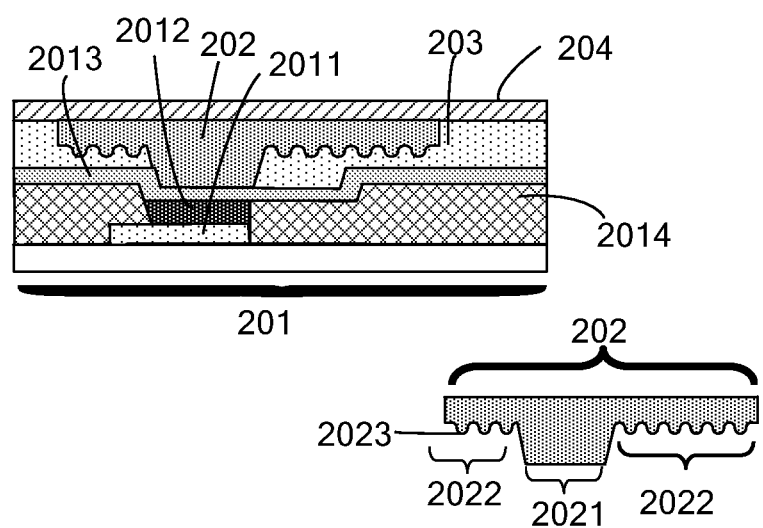
FIG. 2 shows an illustrative partial section view of the transparent display panel according to the first embodiment of the invention taken along the A-A line and watched towards the left side of FIG. 1, in which a light-guiding component of the transparent display panel is additionally and individually shown.

FIG. 1 shows an illustrative top view of a transparent display panel according to a first embodiment of the invention; FIG. 2 shows an illustrative partial section view of the transparent display panel according to the first embodiment of the invention taken along the A-A line and watched towards the left side of FIG. 1, in which a light-guiding component of the transparent display panel is additionally and individually shown. As shown in FIGS. 1 and 2, a transparent display panel comprises a plurality of light-emitting regions 101 and a plurality of transparent regions 102, and a plurality of light-guiding components 202 disposed on a light-emitting side of the transparent display panel. As shown in FIG. 1, one light-emitting region 101 corresponds to one transparent region 102. The transparent display panel also comprises a plurality of subpixels 201, each of which comprises a light-emitting portion and a lightless portion, the light-emitting portion is disposed in a light-emitting region 101 and the lightless portion is disposed in a transparent region 102. The components shown in FIG. 1 but not indicated by signs are known components in the art, which comprises some metal wires, and thin film transistors (TFTs), and will not be described in detail herein.

Optionally, the light-emitting portion comprises a first electrode layer 2011, a light-emitting layer 2012 and a second electrode layer 2013 arranged along a light-emitting direction (the upward direction in FIG. 2), while the lightless portion located in the transparent region does not comprise the first electrode layer and the light-emitting layer, and only comprises a pixel defining layer 2014 and the second electrode layer 2013. Thus, the light-emitting portion can emit light, while the lightless portion cannot emit light and is transparent, such that the transparent display panel can provide a transparent display function. Wherein, the first electrode layer is an anode generally made from a metal, indium tin oxide (ITO) or a laminate of metal and ITO, such as Al, Mo, ITO, Ag/ITO/Ag, Mo/ITO, or the like. The second electrode is a cathode generally made from a conductive film of Ag or an alloy of Ag and Mg.

Optionally, as shown in FIG. 1, the portion of the subpixel within the transparent region 101 is not provided with TFTs and metal wires, so as to increase transparency.

Optionally, in order to decrease loss of light, the first electrode layer 2011 is not only disposed under the light-emitting layer 2012, but also disposed at both sides of the light-emitting layer. Since the first electrode layer 2011 is typically made of a metal, it can reflect light and thereby preventing light from exiting from both sides thereof and reducing the loss of light and increasing light-emitting efficiency.

Light-guiding components 202 are disposed to correspond to the subpixels 201 respectively. Each light-guiding component comprises a first portion 2021 and a second portion 2022; each first portion 2021 is disposed in a corresponding light-emitting region 101 in a light-emitting direction of a light-emitting portion of each subpixel 201; each second portion 2022 is disposed in a corresponding transparent region 102 in the light-emitting direction of a lightless portion of each subpixel 201. A plurality of light-redirecting member 2023 are arranged on a surface of the second portion 2022 adjacent to the subpixel, i.e., the plurality of light-redirecting member 2023 are arranged on a non-light-emitting surface of the second portion 2022. The light-guiding component 202 is configured to direct a part of light emitted by the light-emitting portion of the subpixel (for example, inclined light) into the second portion 2022 from the first portion 2021, and the light exits from a light-emitting side of the second portion 2022 located in the transparent region after being redirected by the plurality light-redirecting members 2023. A main aim of the plurality of light-redirecting members 2023 is to reflect light incident at an angle into the light-guiding component 202 and emit the light from the second portion of the light-guiding component 202, in other words, emit the light from the transparent region 102 of the transparent display panel.

Optionally, in order to facilitate manufacturing of the light-redirecting members 2023, a first resin layer 203 is disposed between the second portion 2022 of the light-guiding component 202 and the lightless portion of the subpixel (i.e., between the second portion 2022 and the cathode 2013), that is, the first resin layer 203 is arranged on a non-light-emitting side of the second portion 2022 of the light-guiding component 202.

Optionally, the light-redirecting members 203 are a plurality of protuberances formed on a side of the light-guiding component 202 adjacent to the first resin layer 203, i.e., protruding toward the first resin layer 203. The protuberance may have any kind of shape, for example, a cross section of the protuberance may be a circle, a triangle, a square, a rectangle, or the like. Concaves, which have shapes and sizes matching with the protuberances, are provided in the first resin layer 203.

The plurality of light-guiding component 202 may be formed from a material having a relative high refractive index, and the refractive index is higher than that of material of the first resin layer 203. A part of the light emitted by the light-emitting portion of each subpixel 201 is transmitted into the first portion 2021 of the light-guiding component 202 at an angle, and the inclined incident light is transmitted into the second portion 2022 of the light-guiding component 202 after being refracted by the first portion 2021. Since the second portion 2022 is located in the transparent region and is provided with a plurality of protuberances 2023 on the surface adjacent to the subpixel, the light transmitted into the second portion 2022 will be reflected by the protuberances 2023 and exit the second portion 2022 from a light-emitting side surface thereof. Thus, the light-guiding component 202 can direct a part of the light emitted by the light-emitting portion of each subpixel 201 to the second portion 2022 thereof from the first portion 2021 thereof, and emit the light through the transparent region 102, such that the defect in prior art, in which the light-emitting region is bright while the lightless region is dark, can be eliminated, and thereby obtaining a transparent display panel having an uniform display brightness.

Alternatively, the light-redirecting member may also be formed as concaves, while the concaves formed in the first resin layer may be alternatively formed as protuberances corresponding to the concaves.

Optionally, a passivation layer (not shown) may be disposed between the first resin layer 203 and the second electrode layer 2013, and the passivation layer may be formed from silicon nitride, for protecting the second electrode layer 2013.

Optionally, the light-guiding component 202 is made from one or more material selected from: allyl ditheylene glycol carbonate, polymethyl methacrylate (PMMA), polycarbonate, and polystyrene. A refractive index of the light-guiding component 202 is in a range of 1.49-1.70. The first resin layer 203 is made from a resin material having a refractive index smaller than that of the light-guiding component 202.

Optionally, the plurality of light-guiding component 202 is separated from each other with isolating layers (not shown), so as to avoid a clutter phenomenon between each of subpixels from occurring.

Optionally, the isolating layers are formed from a black material, for example, one material or a mixture selected from carbon black, black resin, and a black titanium compound lacking of one oxygen atom.

Optionally, a light-emitting portion of a subpixel 201 comprises an organic light-emitting diode (OLED) component, which may emit light of R, G, and B three different colors.

Optionally, the transparent display panel also comprises an encapsulating layer 204 located at the light-emitting side of the light-guiding component 202 and the first resin layer 203 for encapsulating the whole transparent display panel to prevent a corrosion caused by water or oxygen. The encapsulating layer 204 is made from a film of silicon nitride.

In the first embodiment of the invention, positions of the light-emitting portion and the lightless portion of a subpixel may be selected according to practical requirement. An area of the light-emitting portion or an area ratio between the light-emitting portion and the lightless portion may be determined based on the requirement concerning transparency of the transparent display panel. The positions of the first portion and the second portion of the light-guiding component are determined based on the positions of the light-emitting portion and the lightless portion of the subpixel. It is better that the light-emitting portion and the lightless portion of each of the plurality of subpixels are uniformly-spaced, so as to provide a uniform brightness and transparency of the transparent display panel.

Specifically, areas of the light-emitting region 101 and the transparent region 102 or the area ratio between the light-emitting region 101 and the transparent region 102 are determined based on the requirement for the transparency of the transparent display panel.

Therefore, areas of the light-emitting portion and the lightless portion are determined based on the requirement for the transparency of the transparent display panel. For a display panel having a high transparency requirement, the area of the light-emitting portion is configured to be relatively smaller, while the area of the lightless portion is configured to be relatively larger; For a display panel having a low transparency requirement, the area of the light-emitting portion is configured to be relatively larger, while the area of the lightless portion is configured to be relatively smaller.

As a variant of the first embodiment, the light-emitting portion of the subpixel comprises a white light organic light-emitting diode (WOLED) component, which can only emit white light. In this variant, the transparent display panel comprises only one light-guiding component disposed at the light-emitting side of the transparent display panel. The light-guiding component corresponds to the plurality of light-guiding components as a whole, in which the plurality of light-guiding components are not isolated by the isolating layers. The light-guiding component comprises a plurality of first portions and a plurality of second portions, with each first portion and each second portion being identical to the first portion and the second portion of each light-guiding component in the first embodiment, which are description in detail in conjunction with the first embodiment.

In this variant, there are filtering layers located at the light-emitting side of the light-guiding component, for example, RGB filtering layers for filtering the white light emitted by the WOLED to finally obtain colored light such as red light (R), green light (G), blue light (B).

Optionally, the filtering layers comprises three filter layers for R, G, B, which are disposed in the light-emitting region and correspondingly disposed at the light-emitting side of the first portion of the light-guiding component.

Figure 3:
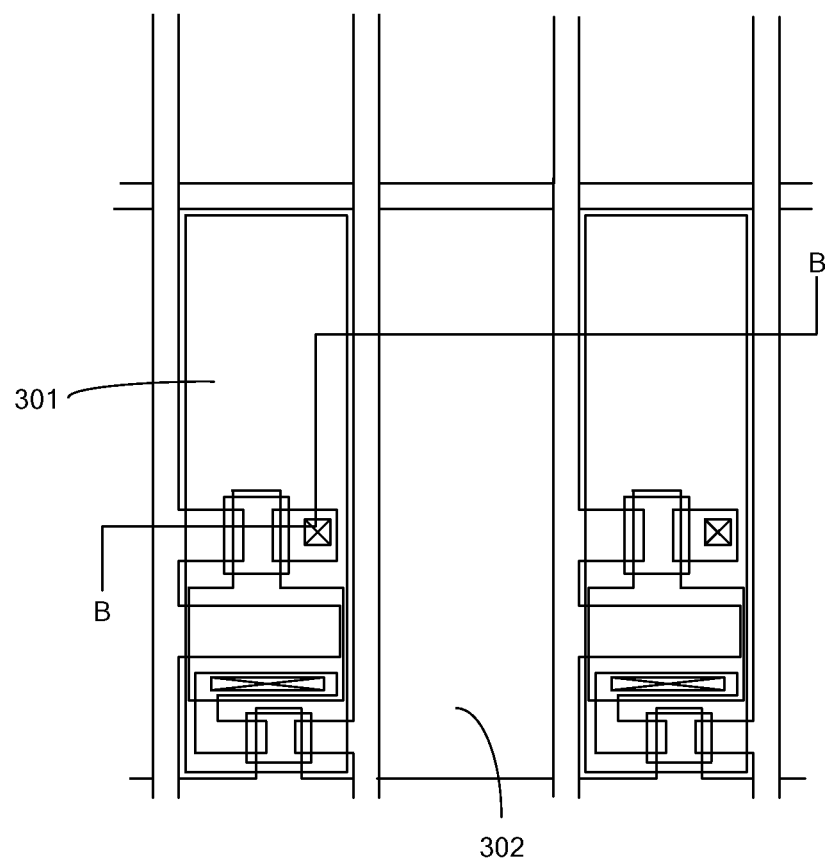
FIG. 3 shows an illustrative top view of a transparent display panel according to a second embodiment of the invention.
Figure 4:
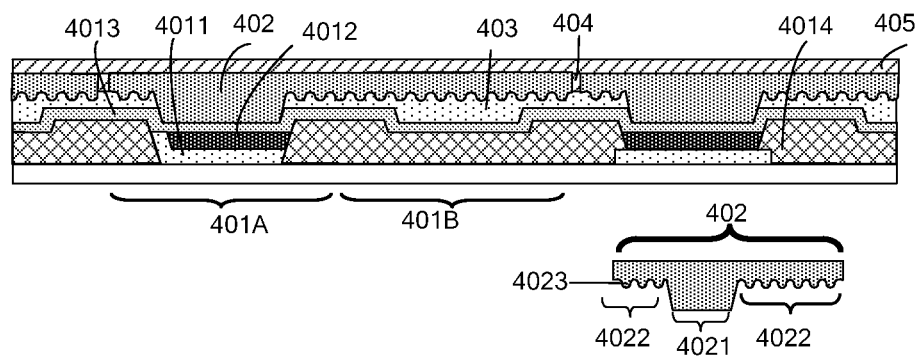
FIG. 4 shows an illustrative partial section view of the transparent display panel according to the second embodiment of the invention taken along the B-B line and watched towards the top side of FIG. 3, in which a light-guiding component of the transparent display panel is additionally and individually shown.

FIG. 3 shows an illustrative top view of a transparent display panel according to a second embodiment of the invention; FIG. 4 shows an illustrative partial section view of the transparent display panel according to the second embodiment of the invention taken along the B-B line and watched towards the top side of the figure. As shown in FIGS. 3 and 4, the transparent display panel comprises a light-emitting region 301 and a transparent region 302, wherein a plurality of light-guiding components 402 are disposed in a light-emitting direction of the transparent display panel. The transparent display panel also comprises a plurality of subpixels 401, wherein the subpixels 401 comprise light-emitting subpixels 401A and lightless subpixels 401B. The light-emitting subpixels 401A are disposed in the light-emitting regions, the lightless subpixels 401B are disposed in the transparent regions, and the light-guiding components 402 are disposed at a light-emitting side of the plurality of subpixels 401.

Optionally, a light-emitting subpixel 401A disposed in a light-emitting region 301 comprises a first electrode layer 4011, a light-emitting layer 4012, and a second electrode layer 4013, while a lightless subpixel 401A disposed in a transparent region does not comprise the first electrode layer and the light-emitting layer, but comprises only a pixel defining layer 4014 and the second electrode layer 4013 in the light-emitting direction. Therefore, the light-emitting subpixel 401A can emit light by itself, while the lightless subpixel 401B is lightless and transparent, such that the transparent display panel can provide a transparent display effect. Wherein, the first electrode layer is an anode, which is usually made from metal or a laminate of metal and indium tin oxide (ITO), such as Al, Mo, Ag/ITO/Ag laminate, Mo/ITO laminate and the like; the second electrode is a transparent cathode, which is usually made from a conductive film made of Ag or an alloy of Ag and Mg.

Optionally, as shown in FIG. 3, in order to increase transparency, the subpixel disposed within the transparent region 301 is not provided with TFTs and metal wires. Since the subpixel disposed within the transparent region 301 does not have to emit light, no TFTs and metal wires are needed to drive the subpixel to emit light, as a result, manufacturing cost can be reduced, and transparency of the transparent region 301 can be increased.

Optionally, in order to decrease loss of light, the first electrode layer 4011 is not only disposed under the light-emitting layer 4012, but also disposed at both sides of the light-emitting layer. Since the first electrode layer 4011 is typically made of a metal, it can reflect light and thereby preventing light from exiting from both sides thereof and reducing the loss of light and increasing light-emitting efficiency.

One light-guiding component 402 is disposed to correspond to at least one light-emitting subpixel 401A and at least one lightless subpixel 401B at the light-emitting side thereof. The light-guiding component comprises a first portion 4021 and a second portion 4022; the first portion 4021 is disposed in a corresponding light-emitting region 301 and substantially at the light-emitting side of the at least one light-emitting subpixel 401A; the second portion 4022 is disposed in a corresponding transparent region 302 and substantially at the light-emitting side of the at least one lightless subpixel 401B, and a surface of the second portion adjacent to the lightless subpixel is provided with a plurality of light-redirecting member 4023, i.e., the plurality of light-redirecting member 4023 are arranged on a non-light-emitting surface of the second portion 4022. Of course, the light-emitting subpixel 401A also comprises a lightless edge region, and the second portion 4022 of the light-guiding component 402 also disposed at a position corresponding to a separating region between the edge portion and two adjacent subpixels; the light-guiding component 402 is configure to direct a part of light emitted by the light-emitting subpixel (for example, inclined light) into the second portion 4022 from the first portion 4021, and the light exits from a light-emitting side of the second portion 4022 located in the transparent region after being redirected by the plurality light-redirecting members 4023. A main aim of the plurality of light-redirecting members 4023 is to reflect light incident at an angle into the light-guiding component 402 and emit the light from the second portion of the light-guiding component 402, in other words, emit the light from the transparent region 302 of the transparent display panel.

Optionally, in order to facilitate manufacturing of the light-redirecting members 4023, a first resin layer 403 is disposed between the second portion 4022 of the light-guiding component 402 and the lightless portion of the subpixel, that is, the resin layer 403 is disposed on a non-light-emitting side of the second portion 4022 of the light-guiding component 402.

Optionally, the light-redirecting members 4023 are a plurality of protuberances formed on a side of the light-guiding component 402 adjacent to the first resin layer 403, i.e., protruding toward the first resin layer 403; the protuberance may have any kind of shape, for example, a cross section of the protuberance may be a circle, a triangle, a square, a rectangle, or the like. Concaves, which have shapes and sizes matching with the protuberances, are provided in the first resin layer 203.

The plurality of light-guiding components 402 may be formed from a material having a relative high refractive index, and the refractive index is higher than that of material of the first resin layer 403. A part of the light emitted by the light-emitting portion of each subpixel 401 is transmitted into the first portion 4021 of the light-guiding component 402 at an angle, and the inclined incident light is transmitted into the second portion 4022 after being refracted by the first portion 4021. Since the second portion 4022 is located in the transparent region and is provided with a plurality of protuberances 4023 on the surface adjacent to the subpixel, the light transmitted into the second portion 4022 will be reflected by the protuberances 4023 and exit the second portion 4022 from a light-emitting side surface thereof. Thus, the light-guiding component 402 can direct a part of the light emitted by the light-emitting portion of each subpixel 401 to the second portion 4022 thereof from the first portion 4021 thereof, and emit the light through the transparent region 302, such that the defect in prior art, in which the light-emitting region is bright while the lightless region is dark, can be eliminated, and thereby obtaining a transparent display panel having an uniform display brightness.

Alternatively, the light-redirecting member may also be formed as concaves, while the concaves formed in the first resin layer may be alternatively formed as protuberances corresponding to the concaves.

Optionally, a passivation layer (not shown) may be disposed between the first resin layer 403 and the second electrode layer 4013, and the passivation layer may be formed from silicon nitride, for protecting the second electrode layer 4013.

Optionally, the light-guiding component 402 is made from one or more material selected from: allyl ditheylene glycol carbonate, polymethyl methacrylate (PMMA), polycarbonate, and polystyrene. A refractive index of the light-guiding component 202 is in a range of 1.40-1.70. The first resin layer 203 is made from a resin material having a refractive index smaller than 1.40.

Optionally, the plurality of light-guiding component 402 is separated from each other with isolating layers 404 so as to avoid a clutter phenomenon between each of subpixels 401 from occurring.

Optionally, the isolating layers 204 are formed from a black material, for example, one material or a mixture selected from carbon black, black resin, and a black titanium compound lacking of one oxygen atom.

Optionally, a light-emitting subpixel comprises an organic light-emitting diode (OLED) component, which may emit light of R, G, and B three different colors.

Optionally, the transparent display panel also comprises an encapsulating layer 405 located at the light-emitting side of the light-guiding component 402 and the first resin layer 403 for encapsulating the whole transparent display panel to prevent a corrosion caused by water or oxygen. The encapsulating layer 405 is made from a film of silicon nitride.

Optionally, light-emitting regions 301 and transparent regions 302 are alternatively distributed, and generally, it is better that the light-emitting regions 301 are evenly distributed in the display region of the whole transparent display panel, and it is better that the transparent regions 302 are evenly distributed in the display region of the whole transparent display panel. Of course, areas of the light-emitting regions 301 and the transparent regions 302 are determined based on the requirement for transparency of the transparent display panel.

Also, the light-emitting subpixels disposed in the light-emitting regions 301 and the lightless subpixels disposed in the transparent regions 302 are alternatively distributed, but they are not distributed in a one-to-one relationship. For a transparent display panel having a low transparency requirement, a total area of the light-emitting regions may be larger than a total area of the transparent regions, that is, the number of the light-emitting subpixels may be larger than the number of the lightless subpixels; for a transparent display panel having a high transparency requirement, a total area of the light-emitting regions may be smaller than a total area of the transparent regions, that is, the number of the light-emitting subpixels may be less than the number of the lightless subpixels. A first portion 4021 of the light-guiding component 402 corresponds to at least one light-emitting subpixel within the light-emitting regions 301. If one of the light-emitting regions 301 is provided with a plurality of light-emitting subpixels adjacent to each other, the first portion 4021 of the light-guiding component 402 may correspondingly disposed at the light-emitting side of the plurality of light-emitting subpixels adjacent to each other, while the second portion 4022 is correspondingly disposed at the light-emitting side of one or more lightless subpixels arranged around and adjacent to the plurality of light-emitting subpixels adjacent to each other, for directing a part of the light emitted by the plurality of light-emitting subpixels adjacent to each other to the transparent region 302 where the one or more lightless subpixels are located.

Figure 5:
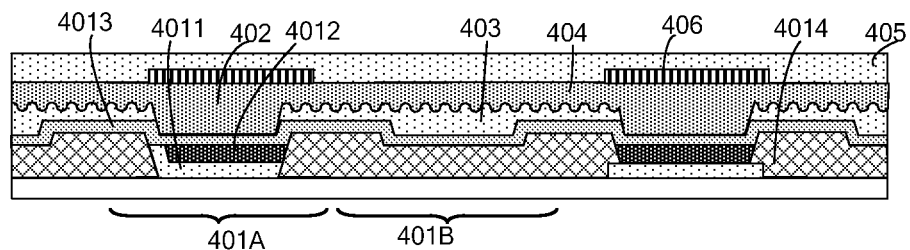
FIG. 5 shows an illustrative partial section view of a transparent display panel according to an alternative embodiment of the second embodiment of the invention.

Moreover, as a variant of the second embodiment, the light-emitting subpixel comprises a WOLED component, which can only emit white light. In this variant, as shown in FIG. 5, the transparent display panel comprises only one light-guiding component 402 disposed at the light-emitting side of the transparent display panel. The light-guiding component 402 corresponds to the plurality of light-guiding components in the first embodiment as a whole, in which the plurality of light-guiding components are not isolated by the isolating layers. The light-guiding component comprises a plurality of first portions 4021 and a plurality of second portions 4022, with each first portion 4021 and each second portion 4022 being structurally identical to the first portion and the second portion of each light-guiding component in the first embodiment. Each first portion 4021 of the light-guiding component 402 is arranged in the light-emitting regions at the light-emitting side of a light-emitting subpixel and contacts the light-emitting surface of the light-emitting subpixel, while each second portion 4022 of the light-guiding component 402 is arranged in the transparent regions at the light-emitting side of a lightless subpixel and is separated from the lightless subpixel by a passivation layer, please refer to the first embodiment for the detailed description of the passivation layer.

In this variant, there are filtering layers 406 located at the light-emitting side of the light-guiding component, for example, RGB filtering layers for filtering the white light emitted by the WOLED to finally obtain colored light such as red light (R), green light (G), and blue light (B).

Optionally, the filtering layers comprise three filter layers for R, G, and B, which are disposed in the light-emitting region and correspondingly disposed at the light-emitting side of the first portion of the light-guiding component.

The light-emitting subpixels and the lightless subpixels do not need to be alternated spaced-apart precisely, that is, the number of the light-emitting subpixels does not need to be equal or approximately equal to the number of the lightless subpixels, wherein the number of the lightless subpixels may be determined based on the transparency requirement of the transparent display panel.

Both the first embodiment and the second embodiment are described taking a top-emitting component as an example, in which the light-guiding component is disposed on top of the subpixels. The technical solution provided in this disclosure may also be used in a bottom-emitting component, and in this event, the light-guiding component should be disposed under the subpixels and still at the light-emitting side of the subpixels. A transparent electrode is disposed under the light-emitting layer, and a non-transparent metal electrode is disposed on top of the light-emitting layer.

In the transparent display panel provided by this disclosure, since a light-guiding component is provided, a part of light emitted by a light-emitting portion of a subpixel can be directed to a lightless portion thereof, that is, a part of light in the light-emitting regions is directed to the transparent regions, so as to increase display uniformity of the transparent display panel and provide a better display performance.

Moreover, the transparent display panel provided in this disclosure is not limited to the two manners as described in the first embodiment and the second embodiment, but can comprise any other transparent display panels that have a light-guiding component. For example, a first part of multiple subpixels of a transparent display panel are identical to those in the first embodiment, i.e., each of the first part of subpixels comprises a light-emitting portion and a lightless portion, while a second part of the multiple subpixels other than the first part are identical to those in the second embodiment, i.e., the second part comprise light-emitting subpixels and lightless subpixels. Wherein, the light-emitting portions of the subpixels are disposed in the light-emitting regions, and the lightless portions of the subpixels are disposed in the transparent regions; the light-emitting subpixels are disposed in the light-emitting regions, and the lightless subpixels are disposed in the transparent regions. The first part and the second part of the subpixels are distributed according to practical situation, and there may be one or more light-guiding components, which is determined based on the distribution of subpixels, as long as a part of light emitted by the self-illuminating subpixels or portions of the self-illuminating subpixels can be directed to surrounding transparent regions. Thus, all variants utilizing the principle of directing a part of light from light-emitting regions to transparent regions in the transparent display panel by using a light-guiding component shall fall within the scope of this disclose.

Embodiments of this disclosure further provide a transparent display device comprising the transparent display panel as described above.

Embodiments of this disclosure further provide a manufacturing method for making the transparent display panel. The method comprises a step of: manufacturing a transparent display panel comprising a plurality of light-emitting regions and a plurality of transparent regions; wherein the step of manufacturing a transparent display panel comprises manufacturing at least one light-guiding component for transmitting a part of light emitted from a light-emitting region to a transparent region on a light-emitting side of the transparent display panel.

Optionally, the step of manufacturing a transparent display panel comprises forming a plurality of subpixels, each of which comprises a light-emitting portion formed in a light-emitting region and a lightless portion formed in a transparent region.

Alternately, the step of manufacturing a transparent display panel comprises forming a plurality of subpixels comprising a plurality of light-emitting subpixels formed in the light-emitting regions and a plurality of lightless subpixels formed in the transparent regions.

Alternately, the step of manufacturing a transparent display panel comprises forming a plurality of subpixels comprising at least one first subpixel, at least one second subpixel, and at least one third subpixel; wherein each of the at least one first subpixel comprises a light-emitting portion formed in a light-emitting region and a lightless portion formed in a transparent region; and wherein each of the at least one second subpixel is a light-emitting subpixel formed in a light-emitting region, and each of the at least one third subpixel is a lightless subpixel formed in a transparent region.

The following are flow charts showing specific methods for manufacturing the transparent display panels according to the first and second embodiments.

Figure 6:
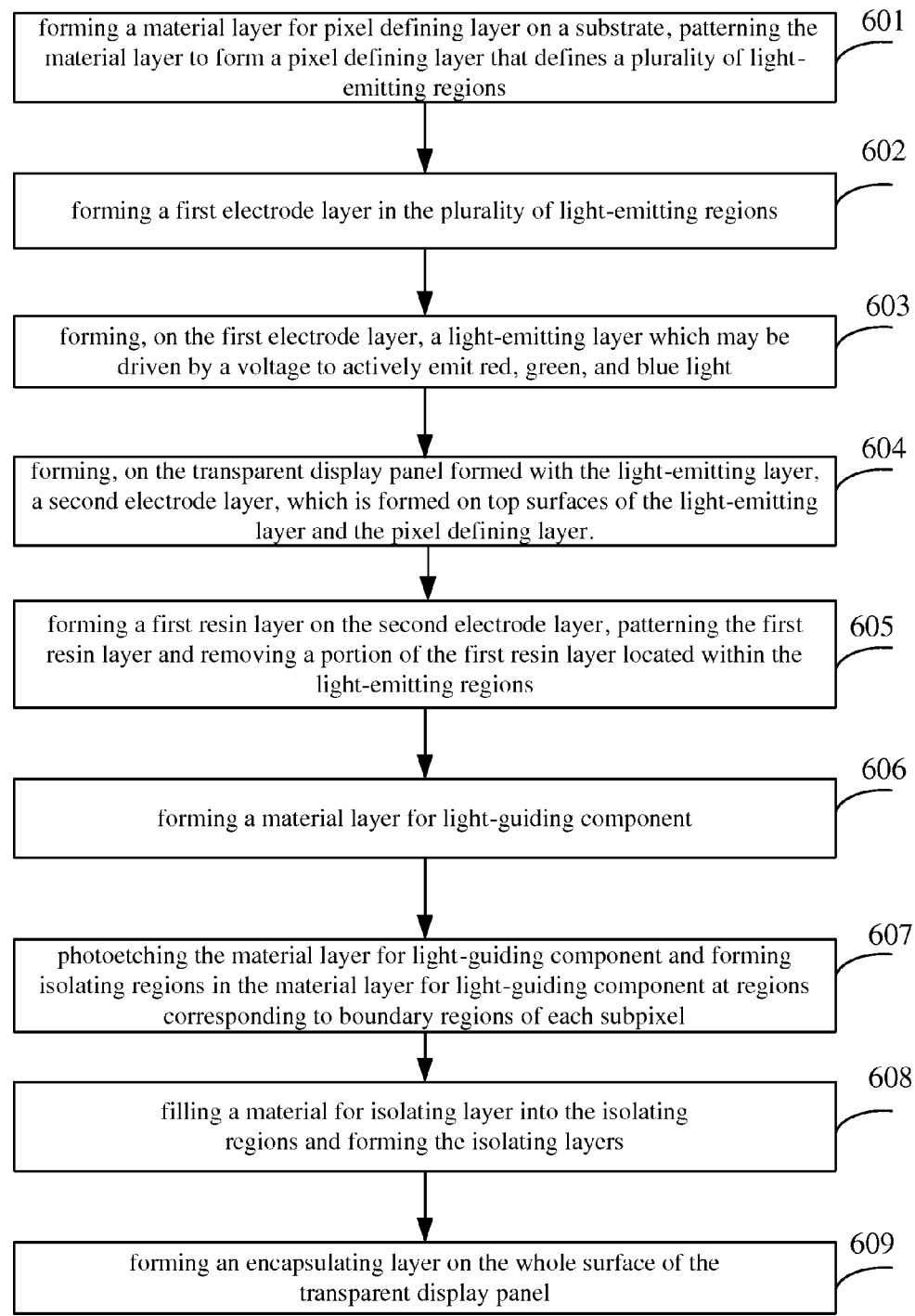
FIG. 6 shows a flow chat of a manufacturing method for the transparent display panel according to the first embodiment of the invention.

FIG. 6 shows a flow chat of a method for manufacturing the transparent display panel according to the first embodiment of the invention. As shown in FIG. 6, the method comprises the following steps:

Step 601: forming a material layer for pixel defining layer on a substrate, patterning the material layer to form a pixel defining layer that defines a plurality of light-emitting regions.

Wherein, each light-emitting region corresponds to a light-emitting portion of one subpixel; and optionally, the substrate may be an array substrate or a glass substrate.

Step 602: forming a first electrode layer in the plurality of light-emitting regions.

Optionally, the first electrode layer is a nontransparent anode made from a metal material or a laminate of a metal and ITO, such as Al, Mo, Ag/ITO/Ag, Mo/ITO, or the like.

Optionally, the first electrode layer may be formed in a planar shape, or a shape having an edge extending upward along the pixel defining layer. As a result, after a light-emitting layer, which will be described later, is made, the first electrode is also disposed at a lateral side of the light-emitting layer to reflect light emitted by the light-emitting layer from its lateral side, thereby reducing lost of light.

Step 603: forming a light-emitting layer on the first electrode layer.

Optionally, the light-emitting layer may be driven by a voltage to actively emit three colored light, which is red light (R), green light (G), and blue light (B).

Step 604: forming a second electrode layer on the transparent display panel formed with the light-emitting layer, the second electrode layer being formed on top surfaces of the light-emitting layer and the pixel defining layer.

Optionally, the second electrode is a transparent cathode made from a conductive film of Ag or an alloy of Ag and Mg.

Step 605: forming a first resin layer on the second electrode layer, patterning the first resin layer and removing a portion of the first resin layer located within the light-emitting regions.

Optionally, a plurality of concaves are formed in a surface of the first resin layer.

Optionally, patterning the first resin layer comprises steps of: applying a photoresist on the first resin layer, and exposing and developing the photoresist. Optionally, the exposing step comprises performing a full exposure in the light-emitting regions and performing a gray exposure in the transparent regions other than the light-emitting regions.

Step 606: forming a material layer for light-guiding component.

The material layer for light-guiding component is made from a transparent material having a high refractive index, for example, a material or a combination selected from: allyl ditheylene glycol carbonate, polymethyl methacrylate, polycarbonate, and polystyrene, and the refractive index is in a range from 1.45 to 1.70.

Optionally, the material layer for light-guiding component is formed with a plurality of protuberances corresponding to the plurality of concaves on a surface thereof facing to the surface of the first resin layer.

Step 607: photoetching the material layer for light-guiding component and forming isolating regions in the material layer for light-guiding component at regions corresponding to boundary regions of each subpixel.

Step 608: filling a material for isolating layer into the isolating regions and forming the isolating layers.

Specifically, a black material may be filled or coated into the isolating regions. More specifically, a black resin material is coated into the isolating regions and then exposed and developed to form the isolating layers.

Step 609: forming an encapsulating layer on the whole surface of the transparent display panel.

As to the variant embodiment of the first embodiment, steps 601 to 606 thereof are identical to the steps 601 to 606 of the first embodiment, and the differences therebetween lie in the following two aspects: (1) different materials for the light-emitting layer, the material for light-emitting layer in this variant embodiment is a material that emits white light; and (2) since the material is different, the following step 607a is used to replace the step 607 and step 608 of the first embodiment, and the following step 608a is identical to step 609 of the first embodiment.

Step 607a: forming a filtering layer on the material layer for light guiding component.

Specifically, coating, exposing and developing a red photoresist material to obtain a pattern for a red filter layer, that is, only the red photoresist material located at positions corresponding to the light-emitting portions of red subpixels are retained, while the red photoresist material located in other regions are removed;

performing a similar process of coating, exposing and developing a green filter layer to obtain a pattern for a green filter layer; and performing a similar process of coating, exposing and developing a blue filter layer to obtain a pattern for a blue filter layer.

Step 608a: forming an encapsulating layer on the whole surface of the transparent display panel.

Figure 7:
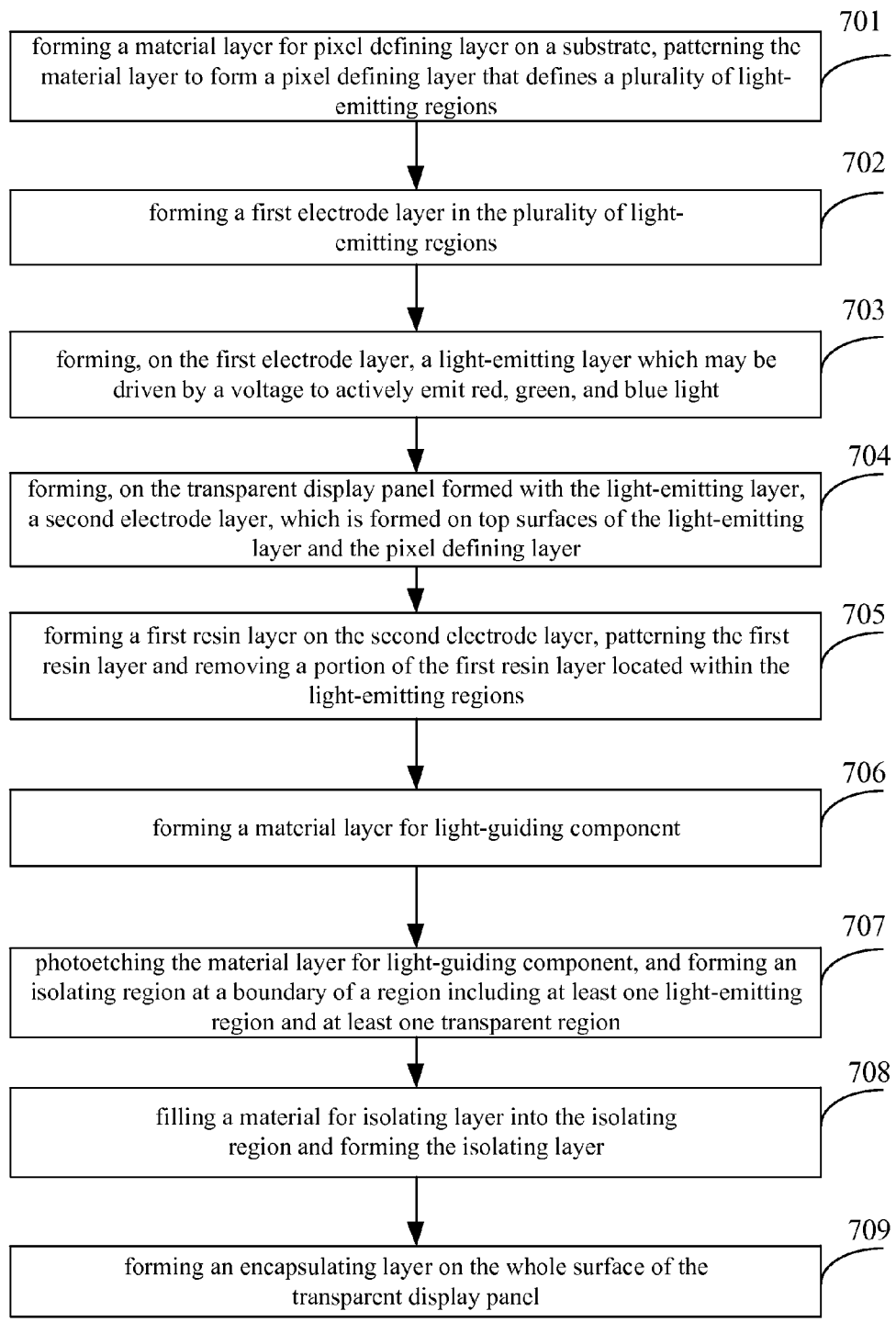
FIG. 7 shows a flow chat of a manufacturing method for the transparent display panel according to the second embodiment of the invention.

FIG. 7 shows a flow chat of a manufacturing method for the transparent display panel according to the second embodiment of the invention. As shown in FIG. 7, the method comprises the following steps:

Step 701: forming a material layer for pixel defining layer on a substrate, patterning the material layer to form a pixel defining layer that defines a plurality of light-emitting regions.

Wherein, each light-emitting region corresponds to at least one light-emitting subpixel, and each transparent region corresponds to at least one lightless subpixel. Optionally, the light-emitting regions and the transparent regions are alternatively distributed.

Of course, the light-emitting regions and the transparent regions do not have to be alternatively distributed in a one-to-one relationship, and a specific distribution thereof is determined based on transparency requirement of the transparent display panel.

Optionally, the substrate may be an array substrate or a glass substrate.

Step 702: forming a first electrode layer in the plurality of light-emitting regions.

Optionally, the first electrode layer is a nontransparent anode made from a metal material or a laminate of a metal and ITO, such as Al, Mo, Ag/ITO/Ag, Mo/ITO, or the like.

Optionally, the first electrode layer may be formed in a planar shape, or a shape having an edge extending upward along the pixel defining layer. As a result, after a light-emitting layer is made, the first electrode is also disposed at a lateral side of the light-emitting layer to reflect light emitted by the light-emitting layer from its lateral side, thereby reducing lost of light.

Step 703: forming a light-emitting layer on the first electrode layer.

Optionally, the light-emitting layer may be driven by a voltage to actively emit three colored light, which is red light (R), green light (G), and blue light (B).

Step 704: forming a second electrode layer on the transparent display panel formed with the light-emitting layer, the second electrode layer being formed on top surfaces of the light-emitting layer and the pixel defining layer.

Optionally, the second electrode is a transparent cathode made from a conductive film of Ag or an alloy of Ag and Mg.

Step 705: forming a first resin layer on the second electrode layer, patterning the first resin layer and removing a portion of the first resin layer located within the light-emitting regions.

Optionally, a plurality of concaves are formed in a surface of the first resin layer.

Optionally, patterning the first resin layer comprises steps of: applying a photoresist on the first resin layer, and exposing and developing the photoresist. Optionally, the exposing step comprises performing a full exposure in the light-emitting regions and performing a gray exposure in the transparent regions other than the light-emitting regions.

Step 706: forming a material layer for light-guiding component. The material layer for light-guiding component is made from a transparent material having a high refractive index, for example, a material or a combination selected from: allyl ditheylene glycol carbonate, polymethyl methacrylate, polycarbonate, and polystyrene, and the refractive index is in a range from 1.45 to 1.70.

Optionally, after filling the plurality of concaves formed in the first resin layer with a material for the light-guiding component, a plurality of protuberances are formed on the surface of the light-guiding component adjacent to the first resin layer.

Step 707: photoetching the material layer for light-guiding component, and forming an isolating region at a boundary of a region including at least one light-emitting region and at least one transparent region.

Step 708: filling a material for isolating layer into the isolating region and forming the isolating layer.

Specifically, a black material may be filled or coated into the isolating region. More specifically, a black resin material is coated into the isolating region and then exposed and developed to form the isolating layer.

Step 709: forming an encapsulating layer on the whole surface of the transparent display panel.

In the transparent display panel manufactured through the method above, a light-guiding component is added for transmitting the light emitted by the light-emitting subpixels in the light-emitting regions to the transparent regions, and a plurality of light-redirecting members formed on a surface of the light-guiding component are used to change the direction of light transmitted to the transparent regions and to emit the light from the light-emitting side of the transparent regions. As a result, display uniformity of the whole transparent display panel is improved, and a better display performance can be achieved.

Although aims, technical solution and technical effects of this disclosure have been described above in connection with the above detailed embodiments, it should be understood that those are just ways of implementing this disclosure, which are used to limit this disclosure. All the modifications, substitutions, and improvement made within the spirit and principle of this disclosure shall fall within the scope of this disclosure.

What is claimed is:

1. A transparent display panel, comprising:
a plurality of light-emitting regions;
a plurality of transparent regions; and
at least one light-guiding component disposed on a light-emitting side of the transparent display panel,
wherein the at least one light-guiding component is configured to transmit a part of light emitted from the light-emitting regions to the transparent regions,
and wherein the at least one light-guiding component comprises a first portion disposed in a corresponding light-emitting region and a second portion disposed in a corresponding transparent region, and wherein a non-light-emitting surface of the second portion of the at least one light-guiding component is provided with a plurality of light-redirecting elements.

2. The transparent display panel according to claim 1, wherein the plurality of light-redirecting elements are a plurality of protuberances or concaves.

3. The transparent display panel according to claim 2, wherein a first resin layer is disposed on a non-light-emitting side of the second portion of the light-guiding component and in contact with the non-light-emitting surface of the second portion of the light-guiding component, the first resin layer having, on a surface thereof contacting the second portion of the light-guiding component, a plurality of concaves or protuberances matching with the plurality of protuberances or concaves of the light-guiding component.

4. The transparent display panel according to claim 3, wherein a material of the light-guiding component has a refractive index higher than that of a material of the first resin layer.

5. The transparent display panel according to claim 1, further comprising a plurality of subpixels, wherein each subpixel comprises a light-emitting portion and a lightless portion, the light-emitting portions of the subpixels are disposed in the light-emitting regions and the lightless portions of the subpixels are disposed in the transparent regions.

6. The transparent display panel according to claim 5, wherein the light-emitting portion of each subpixel comprises a first electrode layer, a light-emitting layer, and a second electrode layer, and the lightless portion of each subpixel does not comprise the first electrode layer and/or the light-emitting layer.

7. The transparent display panel according to claim 5, wherein the transparent display panel comprises a plurality of light-guiding components, the first portion of each light-guiding component is disposed on a light-emitting side of the light-emitting portion of a corresponding subpixel, and the second portion of each light-guiding component is disposed on a light-emitting side of the lightless portion of the corresponding subpixel.

8. The transparent display panel according to claim 7, further comprising isolating layers disposed between adjacent light-guiding components of the plurality of light-guiding components.

9. The transparent display panel according to claim 5, wherein the transparent display panel comprises one light-guiding component comprising a plurality of first portions and a plurality of second portions, each first portion is disposed on a light-emitting side of the light-emitting portion of a corresponding subpixel, and each second portion is disposed on a light-emitting side of the lightless portion of the corresponding subpixel.

10. The transparent display panel according to claim 1, further comprising a plurality of subpixels, wherein the plurality of subpixels comprise a plurality of light-emitting subpixels and a plurality of lightless subpixels, the light-emitting subpixels are disposed in the light-emitting regions, and the lightless subpixels are disposed in the transparent regions.

11. The transparent display panel according to claim 10, wherein each light-emitting subpixel comprises a first electrode layer, a light-emitting layer, and a second electrode layer, and each lightless subpixel does not comprise a first electrode layer and/or a light-emitting layer.

12. The transparent display panel according to claim 10, wherein the transparent display panel comprises a plurality of light-guiding components, the first portion of each light-guiding component is disposed on a light-emitting side of at least one corresponding light-emitting subpixel, and the second portion of each light-guiding component is disposed on a light-emitting side of at least one corresponding lightless subpixel.

13. The transparent display panel according to claim 10, wherein the transparent display panel comprises one light-guiding component comprising a plurality of first portions and a plurality of second portions, each first portion is disposed on a light-emitting side of at least one corresponding light-emitting subpixel, and each second portion is disposed on a light-emitting side of at least one corresponding lightless subpixel.

14. The transparent display panel according to claim 1, further comprising a plurality of subpixels, wherein the plurality of subpixels comprise at least one first subpixel, at least one second subpixel, and/or at least one third subpixel;
wherein each first subpixel comprises a light-emitting portion and a lightless portion, the light-emitting portion of the first subpixel is disposed in the light-emitting region and the lightless portion of the first subpixel is disposed in the transparent region; and
wherein each second subpixel is light-emitting subpixel located in the light-emitting region and the at least one third subpixel is lightless subpixel located in the transparent region.

15. The transparent display panel according to claim 1, wherein a subpixel located in the transparent regions is not provided with a thin film transistor and a metal wire.

16. A transparent display device, comprising the transparent display panel according to claim 1.

17. The transparent display panel according to claim 12, further comprising isolating layers disposed between adjacent light-guiding components of the plurality of light-guiding components.

18. A manufacturing method for a transparent display panel, comprising a step of:
manufacturing a transparent display panel comprising a plurality of light-emitting regions and a plurality of transparent regions,
wherein the step of manufacturing a transparent display panel comprises manufacturing at least one light-guiding component for transmitting a part of light emitted from a light-emitting region to a transparent region on a light-emitting side of the transparent display panel, wherein the light-guiding component comprises a first portion disposed in a corresponding light-emitting region and a second portion disposed in a corresponding transparent region, and wherein a non-light-emitting surface of the second portion of the light-guiding component is provided with a plurality of light-redirecting elements.

19. The manufacturing method according to claim 18, wherein the step of manufacturing a transparent display panel further comprises forming a pixel defining layer and patterning the pixel defining layer to form portions corresponding to the light-emitting regions and portions corresponding to the transparent regions.

20. The manufacturing method according to claim 18, wherein the step of manufacturing at least one light-guiding component comprises steps of:
forming a first resin layer on a subpixel;
patterning the first resin layer to remove a portion of the first resin layer located in the light-emitting regions so as to expose the subpixel, and to form a plurality of concaves or protuberances on a surface of the first resin layer located in the transparent regions; and
forming, on the exposed subpixel and on the first resin layer, a material layer for light-guiding component.

21. The manufacturing method according to claim 20, wherein the step of manufacturing at least one light-guiding component further comprises steps of:
forming, in the material layer for light-guiding component, an isolating layer at a boundary of a region including at least one light-emitting region and at least one transparent region.

22. The manufacturing method according to claim 21, wherein the step of forming the isolating layer comprises:
forming, in the material layer for light-guiding component, an isolating region at the boundary of the region including at least one light-emitting region and at least one transparent region; and
filling an isolating material into the isolating region or coating an isolating material in the isolating region.

23. The manufacturing method according to claim 18, further comprising a step of:
forming, outside the transparent display panel and the at least one light-guiding component, an encapsulating layer.

* * * * *